US006391932B1

(12) United States Patent
Gore et al.

(10) Patent No.: US 6,391,932 B1
(45) Date of Patent: May 21, 2002

(54) POROUS MATERIALS

(75) Inventors: Robert H. Gore, Southampton; Michael K. Gallagher, Lansdale; Scott A. Ibbitson, Trappe, all of PA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/634,817

(22) Filed: Aug. 8, 2000

(51) Int. Cl.$^7$ .................................................. C08J 9/26
(52) U.S. Cl. .............................. 521/61; 521/63; 521/77; 521/134; 521/184; 521/185; 521/189; 438/622; 438/623; 438/624; 438/763; 438/780; 438/781
(58) Field of Search .............................. 521/61, 63, 77, 521/134, 184, 185, 189; 438/623, 624, 622, 780, 763, 781

(56) References Cited

U.S. PATENT DOCUMENTS

| | | | |
|---|---|---|---|
| 4,978,692 A | * 12/1990 | Ezawa et al. ................ | 521/185 |
| 5,700,844 A | 12/1997 | Hedrick et al. | |
| 5,776,990 A | * 7/1998 | Hedrick et al. ............. | 521/184 |
| 5,969,088 A | 10/1999 | Ezzell et al. | |
| 6,093,636 A | 7/2000 | Carter et al. | |
| 6,271,273 B1 | * 8/2001 | You et al. ................... | 438/781 |

FOREIGN PATENT DOCUMENTS

| | | |
|---|---|---|
| JP | 11-322992 | 11/1999 |
| WO | WO 00/31183 | 6/2000 |
| WO | WO/0061834 | 10/2000 |

OTHER PUBLICATIONS

Carter et al., "Polyimide Nanofoams for Low Dielectric Applications", Mat. Res. Soc. Symp. Proc. vol. 381, (1995) Materials Research Society, pp. 79–91.

Hedrick et al. "High $T_g$ Polyimide Nanofoams Derived from Pyromellitic Dianhydride and 1,1–Bis(4–aminophenyl)–1–phenyl–2,2,2–trifluoroethane", Journal of Polymer Science Part, Polymer Chemistry, vol. 34.2877 (1996), pp. 2867–2877.

Hedrick et al., "Nanoporous Polyimides", Advances in Polymer Science, vol. 141, (1999), pp. 2–43.

* cited by examiner

Primary Examiner—John M. Cooney, Jr.
(74) Attorney, Agent, or Firm—S. Matthew Cairns

(57) ABSTRACT

Porous polyimide dielectric materials having low dielectric constants useful in electronic component manufacture are disclosed along with methods of preparing the porous polyimide dielectric materials. Also disclosed are methods of forming integrated circuits containing such porous polyimide dielectric material.

19 Claims, No Drawings

POROUS MATERIALS

BACKGROUND OF THE INVENTION

This invention relates generally to porous materials. In particular, this invention relates to the preparation and use of porous films containing polyimide materials and having a low dielectric constant.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components. A method for reducing the dielectric constant of such interlayer, or intermetal, insulating material is to incorporate within the insulating film very small, uniformly dispersed pores or voids.

Porous dielectric matrix materials are well known in the art. One known process of making a porous dielectric involves co-polymerizing a thermally labile monomer with a dielectric monomer to form a block copolymer, followed by heating to decompose the thermally labile monomer unit. See, for example, U.S. Pat. No. 5,776,990. In this approach, the amount of the thermally labile monomer unit is limited to amounts less than about 30% by volume. If more than about 30% by volume of the thermally labile monomer is used, the resulting dielectric material has cylindrical or lamellar domains, instead of pores or voids, which lead to interconnected or collapsed structures upon removal, i.e., heating to degrade the thermally labile monomer unit. See, for example, Carter et. al., Polyimide Nano foams from Phase-Separated Block Copolymers, *Electrochemical Society Proceedings,* volume 97–8, pages 32–43 (1997). Thus, the block copolymer approach provides only a limited reduction in the dielectric constant of the matrix material.

Another known process for preparing porous dielectric materials disperses thermally removable particles in a dielectric precursor, polymerizing the dielectric precursor without substantially removing the particles, followed by heating to substantially remove the particles, and, if needed, completing the curing of the dielectric material. See, for example, U.S. Pat. No. 5,700,844. In the '844 patent, uniform pore sizes of 0.5 to 20 microns are achieved. However, this methodology is unsuitable for such electronic devices as integrated circuits where feature sizes are expected to go below 0.25 microns.

Copending U.S. patent application Ser. No. 09/460,326 (Allen et al.), discloses porogen particles that are substantially compatibilized with B-staged dielectric matrix materials. However, this patent application does not broadly teach how to prepare porous dielectric layers containing polyimide materials.

Polyimides are well known dielectric materials. For example, U.S. Pat. No. 5,969,088 (Ezzell et al.) discloses a dielectric material for use in an electronic device including a polyimide having a plurality of pendant fluorene groups and having a dielectric constant of less than 2.75. A wide variety of such polyimide materials are disclosed in this patent. Neither porous polyimide dielectric materials, nor methods of preparing porous polyimide dielectric materials are disclosed in this patent.

Carter et al., Polyimide Nanofoams for Low Dielectric Applications, *Mat. Res. Soc. Symp. Proc.,* vol. 381, pp 79–91, 1995 and Hedrick et al., High Tg Polyimide Nanofoams Derived from Pyromellitic Dianhydride and 1,1-Bis (4-aminophenyl)-1-phenyl-2,2,2-trifluoroethane, *J. Polymer Sci.,* vol. 34, pp 2867–2877, 1996, disclose polyimide nanofoams prepared by first forming an A-B-A block (or triblock) copolymer with polyimide endcapping units and then casting a film from a solution of the copolymer. Upon heating, the thermally unstable block copolymer component, either a poly(propylene oxide) or a poly(methyl methacrylate), undergoes thermolysis leaving pores in the film, the size and shape of which are dictated by the initial copolymer morphology. In such porous films, the volume fraction of voids was considerably less than the volume fraction of propylene oxide in the copolymer, thus indicating that at least partial collapse of the pores had occurred. Such partial pore collapse makes uniform distribution of pores in the film difficult to achieve. Also difficult to achieve from this approach is a high volume fraction of pores in the dielectric film. The extension of this block copolymer approach as a route to rigid and semi-rigid polyimide nanofoams was not successful.

U.S. Pat. No. 6,093,636 (Carter et al.) discloses a method for forming an integrated circuit containing a porous high temperature thermoset, such as a polyimide. Such porous thermosets are prepared by using as pore forming material highly branched aliphatic esters that have functional groups that are further functionalized with appropriate reactive groups such that the functionalized aliphatic esters are incorporated into, i.e. copolymerized with, the vitrifying polymer matrix. Such incorporation of the pore forming material into the matrix restricts the mobility of the pore forming material, i.e. incorporation prevents phase separation of the pore forming material from the matrix. By restricting such mobility, the size of the phase-separated domains is also restricted.

Other methods of preparing porous dielectric materials are known, but suffer from broad distributions of pore sizes, too large pore size, such as greater than 20 microns, or technologies that are too expensive for commercial use, such as liquid extractions under supercritical conditions.

There is thus a need for improved porous polyimide dielectric matrix materials with substantially smaller pore sizes and a greater percent by volume of pores for use in electronic components, and in particular, as an interlayer, or intermetal, dielectric material for use in the fabrication of integrated circuits. There is also a need for porous polyimide dielectric materials where the volume fraction of pores in the film is equivalent to the volume fraction of pore forming material.

SUMMARY OF THE INVENTION

It has now been surprisingly found that certain polymeric particles (or porogens) incorporated into polyimide dielectric matrix provide porous films having a suitable dielectric constant and sufficiently small pore size for use as insulating material in electronic devices such as integrated circuits and printed wiring boards. Such polymeric particles provide polyimide dielectric matrix material having a greater percentage of pores by volume and more uniformly dispersed pores than are available from known approaches to polyimide nanofoams.

In a first aspect, the present invention is directed to a method of preparing porous polyimide dielectric materials including the steps of: a) dispersing removable polymeric porogen in B-staged polyimide dielectric matrix material; b) forming a film of the B-staged polyimide dielectric matrix material; c) curing the B-staged polyimide dielectric matrix material to form a polyimide dielectric matrix material; and d) subjecting the polyimide dielectric matrix material to conditions which at least partially remove the porogen to form a porous polyimide dielectric material without substantially degrading the polyimide dielectric material; wherein the porogen is substantially compatible with the B-staged polyimide dielectric matrix material and wherein the porogen includes as polymerized units at least one monomer capable of hydrogen-bonding with the B-staged polyimide dielectric matrix material.

In a second aspect, the present invention is directed to porous polyimide dielectric materials prepared by the method described above.

In a third aspect, the present invention is directed to a method of preparing an integrated circuit including the steps of: a) depositing on a substrate a layer of a composition including B-staged polyimide dielectric matrix material having polymeric porogen dispersed therein; b) curing the B-staged polyimide dielectric matrix material to form a polyimide dielectric matrix material; c) subjecting the polyimide dielectric matrix material to conditions which at least partially remove the porogen to form a porous polyimide dielectric material layer without substantially degrading the polyimide dielectric material; d) patterning the polyimide dielectric layer; e) depositing a metallic film onto the patterned polyimide dielectric layer; and f) planarizing the film to form an integrated circuit; wherein the porogen is substantially compatible with the B-staged polyimide dielectric matrix material and wherein the porogen includes as polymerized units at least one monomer capable of hydrogen-bonding with the B-staged polyimide dielectric matrix material.

In a fourth aspect, the present invention is directed to an integrated circuit prepared by the method described above.

In a fifth aspect, the present invention is directed to a composition including B-staged polyimide dielectric matrix material and polymeric porogen, wherein the porogen is substantially compatible with the B-staged polyimide dielectric matrix material and wherein the porogen includes as polymerized units at least one monomer capable of hydrogen-bonding with the B-staged polyimide dielectric matrix material.

DETAILED DESCRIPTION OF THE INVENTION

As used throughout this specification, the following abbreviations shall have the following meanings, unless the context clearly indicates otherwise: °C.=degrees centigrade; μm=micron; UV=ultraviolet; rpm=revolutions per minute; nm=nanometer; g=gram; wt %=weight percent; L=liter; STY=styrene; DVB=divinylbenzene; ALMA=allyl methacrylate; EHA=2-ethylhexyl acrylate; EHMA=2-ethylhexyl methacrylate; MMA=methyl methacrylate; TMPTA=trimethylolpropane triacrylate; TMPTMA=trimethylolpropane trimethacrylate; HEMA=2-hydroxyethyl methacrylate; DMAEMA=dimethylaminoethyl methacrylate; BzA=benzylacrylate; and PPGMEA260=poly(propylene glycol) methyl ether acrylate having a molecular weight of about 260.

The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "porogen" refers to a pore forming material, that is a polymeric material or particle dispersed in a dielectric material that is subsequently removed to yield pores, voids or free volume in the dielectric material. Thus, the terms "removable porogen," "removable polymer" and "removable particle" are used interchangeably throughout this specification. The terms "pore," "void" and "free volume" are used interchangeably throughout this specification. "Cross-linker" and "cross-linking agent" are used interchangeably throughout this specification. "Polymer" refers to polymers and oligomers, and also includes homopolymers and copolymers. The terms "oligomer" and "oligomeric" refer to dimers, trimers, tetramers and the like. "Monomer" refers to any ethylenically or acetylenically unsaturated compound capable of being polymerized. Such monomers may contain one or more double or triple bonds. As used throughout this specification, the term "polyimide dielectric matrix material" refers to polyimide dielectric material having porogen dispersed or dissolved therein.

The term "B-staged" refers to uncured polyimide dielectric matrix materials. By "uncured" is meant any polyimide material that can be polymerized or cured to form higher molecular weight materials, such as coatings or films. Such B-staged material may be monomeric, oligomeric or mixtures thereof. B-staged material is further intended to include mixtures of polymeric material with monomers, oligomers or a mixture of monomers and oligomers.

"Halo" refers to fluoro, chloro, bromo and iodo. Likewise, "halogenated" refers to fluorinated, chlorinated, brominated and iodinated. Unless otherwise noted, all amounts are percent by weight and all ratios are by weight. All numerical ranges are inclusive and combinable.

The present invention relates to the synthesis, composition, size, distribution and purity of polymer particles useful as removable porogens, i.e., pore forming material. Such porogens are useful for forming porous polyimide dielectric materials in the fabrication of electronic and optoelectronic devices.

The present invention relates to a method of preparing porous polyimide dielectric materials including the steps of: a) dispersing removable polymeric porogen in B-staged polyimide dielectric material to form B-staged polyimide dielectric matrix material; b) forming a film of the B-staged polyimide dielectric matrix material; c) curing the B-staged polyimide dielectric matrix material to form a polyimide dielectric matrix material; and c) subjecting the polyimide dielectric matrix material to conditions which at least partially remove the porogen to form a porous polyimide dielectric material without substantially degrading the polyimide dielectric material; wherein the porogen is substantially compatible with the B-staged polyimide dielectric matrix material and wherein the porogen includes as polymerized units at least one monomer capable of hydrogen-bonding with the B-staged polyimide dielectric matrix material.

The porogens of the present invention are useful in reducing the dielectric constant of polyimide dielectric materials, particularly those materials having low dielectric constants ("k"). A low-k dielectric material is any material having a dielectric constant less than about 4.

The dielectric constant of any polyimide dielectric material may be reduced according to the present invention. Particularly useful polyimides are those containing as polymerized units one or more aromatic monomers, and preferably one or more fluoro- or fluoroalkyl-substituted aromatic monomers. The polyimides useful in the present invention may be prepared by a variety of known methods. For example, see U.S. Pat. No. 5,969,088 (Ezzell et al.) and Carter et al., Polyimide Nanofoams for Low Dielectric Applications, *Mat. Res. Soc. Symp. Proc.,* vol. 381, pp 79–91, 1995, herein incorporated by reference to the extent they teach the preparation of polyimides. Typically, the polyimides of the present invention are prepared by reacting one or more diamines with one or more dianhydrides. Polyimides useful in the present invention preferably comprise the reaction product of approximately equimolar amounts (i.e., 1:1 molar ratio, or approximately 50 mol percent each) of one or more aromatic tetracarboxylic acid dianhydrides and one or more aromatic diamines. Variation in copolymer composition can be used effectively to control polymer properties. When more than one dianhydride is used, each dianhydride can be present in an amount from about 1 to about 49 mol percent of the total reactants, such that the total mol percent of dianhydride is preferably 50 mol percent and at most 51 mol percent. Likewise, when more than one diamine is used, each diamine can be present in from about 1 to about 49 mol percent of the total reactants, such that the total mol percent of diamine is preferably 50 mol percent, and at most 51 mol percent.

Aromatic tetracarboxylic acid dianhydride compounds useful in the preparation of angularity enhancement constructions of the invention are those represented by Formula I,

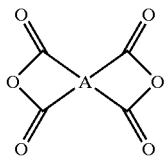
(I)

wherein A is a tetrasubstituted ($C_6$–$C_{20}$)aromatic group. It is preferred that A is a (1) pyromellitic group, (2) a polycyclic aromatic group such as naphthylene, fluorenylene, benzofluorenylene, anthracenylene, and halo, ($C_1$–$C_{10}$) alkyl- or ($C_1$–$C_{10}$)haloalkyl-substituted derivatives thereof, and (3) moieties of Formula II

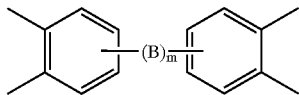
(II)

wherein B is a covalent bond, a C(R)$_2$, CO, O, S, SO$_2$, Si(C$_2$H$_5$)$_2$, N(R$^1$)$_2$, or combinations thereof; m is an integer of 1 to 10; each R is independently selected from H or C(R$^2$)$_3$; each R$^1$ is independently selected from H, ($C_1$–$C_{20}$) alkyl, ($C_1$–$C_{20}$)haloalkyl, ($C_6$–$C_{20}$)aryl or ($C_6$–$C_{20}$)haloaryl groups; and each R$^2$ is independently selected from H, fluorine, or chlorine.

Suitable dianhydrides include, but are not limited to, pyromellitic dianhydride, 3,6-diphenylpyromellitic dianhydride, 3,6-bis(trifluoromethyl)pyromellitic dianhydride, 3,6-bis(methyl)pyromellitic dianhydride, 3,6-diiodopyromellitic dianhydride, 3,6-dibromopyromellitic dianhydride, 3,6-dichloropyromellitic dianhydride, 3,3',4,4'-benzophenonetetracarboxylic acid dianhydride, 2,3,3',4'-benzophenonetetracarboxylic acid dianhydride, 2,2'3,3'-benzophenonetetracarboxylic acid dianhydride, 3,3',4,4'-biphenyltetracarboxylic acid dianhydride, bis(2,3-dicarboxyphenyl)methane dianhydride, bis(2,5,6-trifluoro-3,4-dicarboxyphenyl)methane dianhydride, 2,2-bis(3,4-dicarboxyphenyl)propane dianhydride, 2,2'-bis(3,4-dicarboxyphenyl)hexafluoropropane dianhydride, (6FDA), bis(3,4-dicarboxyphenyl)ether dianhydride, 4,4'-oxy di(phthalic anhydride), 3,3',4,4'-diphenylsulfonetetracarboxylic acid dianhydride, 4,4'-[4,4'-isopropylidene-di(p-phenyleneoxy)]-bis(phthalic anhydride), N,N-(3,4-dicarboxyphenyl)-N-methylamine dianhydride, bis(3,4-dicarboxyphenyl)diethylsilane dianhydride, naphthalene tetracarboxylic acid dianhydrides such as 2,3,6,7- and 1,2,5,6-naphthalenetetracarboxylic acid dianhydrides, 2,6-dichloronaphthalene-1,4,5,8-tetracarboxylic acid dianhydride, and heterocyclic aromatic tetracarboxylic acid dianhydrides such as thiophene-2,3,4, 5-tetracarboxylic acid dianhydride, pyrazine-2,3,5,6-tetracarboxylic acid dianhydride, and pyridine-2,3,5,6-tetracarboxylic acid dianhydride.

The aromatic diamines useful as polymerized units in the polyimides of the present invention include, but are not limited to, those of Formulae III or IV

(III)

(IV)

wherein Ar is an aryl group selected from phenylene, naphthylene, anthrylene, phenanthrylene, heterocyclic groups having at least one of sulfur, nitrogen, or oxygen in the heterocyclic ring, and the like; and L is a linking group selected from a covalent bond, SO$_2$, (CR$^3$R$^4$)$_n$, aryl, O, and S; R$^3$ and R$^4$ are independently selected from hydrogen, ($C_1$–$C_6$)alkyl, halo($C_1$–$C_6$)alkyl, and aryl; and n=1–10. By "haloalkyl" is meant any alkyl group having one or more of its hydrogens replaced by a halo substituent. Suitable haloalkyl groups include trihaloalkyl such as trifluoromethyl. It is preferred that R$^1$ and R$^2$ are the same. The aryl groups may optionally be substituted. "Substituted aryl" refers to replacing one or more hydrogens on one or more of the aromatic rings with another substituent such as ($C_1$–$C_6$) alkyl, halo($C_1$–$C_6$)alkyl, ($C_1$–$C_6$)alkoxy, halo, and the like.

Suitable diamines useful as polymerized units in the polyimides of the present invention include, but are not limited to, o-, m- and p-phenylenediamine, 2-methyl(p-phenylenediamine), 2,5-dimethyl(p-phenylenediamine), 2-ethyl(p-phenylenediamine), 2,5-diethyl(p-phenylenediamine), naphthylenediamine, anthrylenediamine, phenanthrylenediamine, 1,1-bis(4-aminophenyl)-1-phenyl-2,2,2-trifluoroethane, 9,9-bis(aminoaryl)fluorenes such as 9,9-bis(aminophenyl)fluorene, 9,9-bis(3-methyl-4-aminophenyl)fluorene, 9,9-bis(3,5-dimethyl-4-aminophenyl)fluorene, 9,9-bis(3,5-diethyl-4-aminophenyl)fluorene, and 9,9-bis(3-ethyl-5-methyl-4-aminophenyl)fluorene, N,N'-bis(4-aminophenyl)-2,5-(diisopropoxycarbony)benzene-1,4-dicarbox-aide, 2,4-diaminotoluene, 1,4-diamino-2-methoxybenzene, 1,4-diamino-2-phenylbenzene, 1,3-diamino-4-chlorobenzene, 4,4'-diaminobiphenyl, 4,4'-diaminodiphenylmethane, 2,2-bis(4-aminophenyl)propane, 2,2-bis(4-aminophenyl)-1,1,1,3,3,3-hexafluoropropane, 4,4'-diaminodiphenyl ether, 3,4-diaminodiphenyl ether, 1,3-bis(3-aminophenoxy)benzene, 1,3-bis(4-aminophenoxy)benzene, 1,4-bis(4-aminophenoxy)benzene, 4,4'-bis(4-aminophenoxy) biphenyl, 4,4'-bis(3-aminophenoxy)biphenyl, 2,2-bis{4-(4-aminophenoxy)phenyl}propane, 2,2-bis{4-(4-aminophenoxy)phenyl}propane, 2,2-bis{4-(4-aminophenoxy)phenyl}-1,1,1,3,3,3-hexafluoropropane, 4,4'-diaminodiphenyl thioether, 4,4'-diaminodiphenyl sulfone, 2,2'-diaminobenzophenone, 3,3'-diaminobenzophenone; 1,8-diaminonaphthalene, 1,5- diaminonaphthalene, 2,6-diaminopyridine, 2,4-diaminopyrimidine, 2,4-diamino-s-triazine, and combinations thereof.

Polyimides useful in the invention may also comprise monofunctional monomers in the polymerizable composition that can act as end-capping agents to control (or limit) the molecular weight of the polyimide polymer. Monofunctional monomers useful as end-capping agents can include aromatic primary amines and aromatic dicarboxylic acid anhydrides.

Aromatic primary amines useful as end-capping agents can be selected from the group consisting of aniline and aniline derivatives having one or more substituents on the aromatic ring. Substitutents include $(C_1-C_{20})$alkyl groups, $(C_1-C_{20})$haloalkyl groups, $(C_6-C_{20})$aryl groups, $(C_6-C_{20})$haloaryl groups, $(C_6-C_{20})$alkaryl groups, $(C_6-C_{20})$aralkyl groups, fluorine, chlorine, bromine iodine, $(C_1-C_{20})$alkoxy groups, and other common organic substituents, so long as they do not interfere in polymer formation or subsequent processing of the resulting polyimide.

Aromatic dicarboxylic acid anhydrides useful as end-capping agents can be selected from the group consisting of benzene dicarboxylic acid anhydrides, substituted benzene dicarboxylic acid anhydrides, naphthalene dicarboxylic acid anhydrides, substituted naphthalene dicarboxylic acid anhydrides, and related higher aromatic homolog dicarboxylic acid anhydrides. Examples of aromatic dicarboxylic acid anhydrides include phthalic anhydride which can be substituted with $(C_1-C_{20})$alkyl groups, $(C_1-C_{20})$haloalkyl groups, $(C_6-C_{20})$aryl groups, $(C_6-C_{20})$haloaryl groups, $(C_6-C_{20})$alkaryl groups, $(C_6-C_{20})$aralkyl groups, fluorine, chlorine, bromine, iodine, $(C_1-C_{20})$alkoxy groups, and other common organic substituents, so long as they do not interfere in polymer formation or subsequent processing of the resulting polyimide; 1,2-naphthalene dicarboxylic acid anhydride, 2,3-naphthalene dicarboxylic acid anhydride, 3,4-naphthalene dicarboxylic acid anhydride, any of which naphthalene dicarboxylic acids can be substituted with $(C_1-C_{20})$alkyl groups, $(C_6-C_{20})$aryl groups, $(C_6-C_{20})$alkaryl groups, $(C_6-C_{20})$aralkyl groups, fluorine, chlorine, bromine, iodine, $(C_1-C_{20})$alkoxy groups, and other common organic substituents, so long as they do not interfere in polymer formation or subsequent processing of the resulting polyimide.

When present, end-capping agents can comprise up to about 1 mol % of the total polymer composition such that the overall molar ratio of anhydride to amine remains essentially 1:1. Preferably, end-capping agents useful in the invention are solids at about 23° C. (approximately room temperature), for ease of handling.

It will be appreciated that a mixture of dielectric materials may be used in the present invention, such as two or more polyimide dielectric materials or a mixture of a polyimide dielectric material with one or more other dielectric materials, i.e. not a polyimide dielectric material. Suitable other dielectric materials include, but are not limited to, inorganic materials such as organo polysilicas, carbides, oxides, nitrides and oxyfluorides of silicon, boron, or aluminum; and organic matrix materials such as benzocyclobutenes, poly(aryl esters), poly(ether ketones), polycarbonates, polynorbornenes, poly(arylene ethers), polyaromatic hydrocarbons, such as polynaphthalene, polyquinoxalines, poly(perfluorinated hydrocarbons) such as poly(tetrafluoroethylene), and polybenzoxazoles. Thus, the porogens of the present invention may be combined with a polyimide/other dielectric material mixture to form a polyimide/other dielectric matrix material.

It is preferred that when a mixture of a polyimide dielectric matrix material and another dielectric matrix material is used, the polyimide dielectric matrix material is present as a predominant component.

The porogen polymers of the present invention are typically cross-linked particles and have a molecular weight or particle size suitable for use as a modifier in advanced interconnect structures in electronic devices. Typically, the useful particle size range for such applications is up to about 1,000 nm, such as that having a mean particle size in the range of about 0.5 to about 1000 nm. It is preferred that the mean particle size is in the range of about 0.5 to about 200 nm, more preferably from about 0.5 to about 50 nm, and most preferably from about 1 nm to about 20 nm. An advantage of the present process is that the size of the pores formed in the dielectric matrix are substantially the same size, i.e., dimension, as the size of the removed porogen particles used. Thus, the porous dielectric material made by the process of the present invention has substantially uniformly dispersed pores with substantially uniform pore sizes having a mean pore size in the range of from 0.5 to 1000 nm, preferably 0.5 to 200 nm, more preferably 0.5 and 50 nm and most preferably 1 to 20 nm.

The polymeric porogens include as polymerized units at least one monomer capable of hydrogen-bonding with the B-staged polyimide dielectric matrix material. Suitable monomers capable of hydrogen-bonding with the polyimide matrix material include, but are not limited to, primary, secondary or tertiary amine substituted monomers, hydroxyl substituted monomers, fluorinated monomers, carboxylic acid containing monomers, ketone containing monomers, ester containing monomers, ether containing monomers and the like. Such monomers capable of hydrogen-bonding with the B-staged polyimide dielectric matrix material may be polymerized to form the polymer backbone of the porogen particles or may be used as a cross-linking agent or both.

It is preferred that the hydrogen-bonding monomers are "strong" hydrogen-bonding monomers, such as primary, secondary or tertiary amine substituted monomers, hydroxyl substituted monomers, fluorinated monomers and carboxylic acid containing monomers. It is further preferred that when the hydrogen-bonding monomer is a "weak" hydrogen-bonding monomer such as ketones, esters or ethers, that a second hydrogen-bonding monomer be used. It is still further preferred that such second hydrogen-bonding monomer is a strong hydrogen-bonding monomer.

Suitable monomers capable of hydrogen-bonding with the B-staged polyimide dielectric matrix material include, but are not limited to, hydroxyalkyl (meth)acrylates such as 2-hydroxyethyl (meth)acrylate, hydroxystyrenes, primary-, secondary- or tertiary-aminoalkyl (meth)acrylates such as dimethylaminoethyl methacrylate, (meth)acrylic acid, poly (alkylene oxides), and mixtures thereof. Preferred monomers include hydroxyalkyl (meth)acrylates, hydroxystyrenes, primary-, secondary- or tertiary-aminoalkyl (meth)acrylates, (meth)acrylic acid and mixtures thereof.

The amount of hydrogen-bonding monomers useful to form the porogens of the present invention is typically from about 1 to about 99% wt, based on the total weight of the monomers used. It is preferred that the hydrogen-bonding monomers are present in an amount of from 1 to about 80% wt, and more preferably from about 5 to about 75% wt.

The hydrogen-bonding monomers may be used either alone or in combination to form the porogens of the present invention. In general, the amount of the hydrogen-bonding monomers needed to compatibilize the porogen with the dielectric matrix depends upon the level of porogen loading desired in the matrix, the particular composition of the polyimide dielectric matrix, and the composition of the porogen polymer. When a combination of hydrogen-bonding monomers is used, the amount of one monomer may be decreased as the amount of the other monomer is increased.

The polymers suitable for use as porogens in the present invention are derived from one or more ethylenically or acetylenically unsaturated monomers including as polymerized units one or more hydrogen-bonding monomers. Such polymer porogens are removable, such as by the unzipping of the polymer chains to the original monomer units which are volatile and diffuse readily through the host matrix material. By "removable" is meant that the polymer particles depolymerize, degrade or otherwise break down into volatile components which can then diffuse through the host dielectric matrix film. The hydrogen bonding monomers of the present invention may be copolymerized with one or more other monomers to form the porogens of the present invention, including, but are not limited to: (meth)acrylic acid, (meth)acrylamides, alkyl (meth)acrylates, alkenyl (meth)acrylates, aromatic (meth)acrylates, vinyl aromatic monomers, nitrogen-containing compounds and their thioanalogs, substituted ethylene monomers, and poly(alkylene oxide) monomers.

Typically, the alkyl (meth)acrylates useful in the present invention are ($C_1$–$C_{24}$) alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed Alfol alcohols from Vista Chemical company, i.e., Alfol 1618 and Alfol 1620, Ziegler catalyzed various Neodol alcohols from Shell Chemical Company, i.e. Neodol 25 L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$–$C_6$)alkyl (meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or "HPMA."

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl)acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri ($C_1$–$C_6$)alkylsilyl (meth)acrylate, γ-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$)

alkylsilyl (meth)acrylate, vinyl $(C_1–C_6)$alkoxydi$(C_1–C_6)$ alkylsilyl (meth)acrylate, vinyl tri$(C_1–C_6)$alkylsilyl (meth) acrylate, and mixtures thereof.

The vinylaromatic monomers useful as unsaturated monomers in the present invention include, but are not limited to: styrene ("STY"), α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, $(C_1–C_{10})$alkoxy, halo$(C_1–C_{10})$ alkyl, carb$(C_1–C_{10})$alkoxy, carboxy, amino, $(C_1–C_{10})$ alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl $(C_1–C_8)$ substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3-methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride and vinylidene bromide.

Suitable poly(alkylene oxide) monomers include, but are not limited to, poly(propylene oxide) monomers, poly (ethylene oxide) monomers, poly(ethylene oxide/propylene oxide) monomers, poly(propylene glycol) (meth)acrylates, poly(propylene glycol) alkyl ether (meth)acrylates, poly (propylene glycol) phenyl ether (meth)acrylates, poly (propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof. Preferred poly (alkylene oxide) monomers include trimethoylolpropane ethoxylate tri(meth)acrylate, trimethoylolpropane propoxylate tri(meth)acrylate, poly(propylene glycol) methyl ether acrylate, and the like. Particularly suitable poly(propylene glycol) methyl ether acrylate monomers are those having a molecular weight in the range of from about 200 to about 2000. The poly(ethylene oxide/propylene oxide) monomers useful in the present invention may be linear, block or graft copolymers. Such monomers typically have a degree of polymerization of from about 1 to about 50, and preferably from about 2 to about 50.

Typically, the amount of poly(alkylene oxide) monomers useful in the porogens of the present invention is from about 1 to about 99% wt, based on the total weight of the monomers used. The amount of poly(alkylene oxide) monomers is preferably from about 2 to about 90% wt, and more preferably from about 5 to about 80% wt.

The polymers useful as porogens in the present invention may be prepared by a variety of polymerization techniques, such as solution polymerization or emulsion polymerization, and preferably by solution polymerization. The solution polymers useful in the present invention may be linear, branched or grafted and may be copolymers or homopolymers. Particularly suitable solution polymers include cross-linked copolymers.

The solution polymers of the present invention may be prepared by a variety of methods, such as those disclosed in U.S. Pat. No. 5,863,996 (Graham) and U.S. patent application Ser. No. 09/460,326, both of which are hereby incorporated by reference to the extent they teach the preparation of such polymers. The solution polymers of the present invention are generally prepared in a non-aqueous solvent. Suitable solvents for such polymerizations are well known to those skilled in the art. Examples of such solvents include, but are not limited to: hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and t-butanol.

The solution polymer porogens of the present invention typically have a weight average molecular weight in the range of 5,000 to 1,000,000, preferably in the range of 10,000 to 500,000 and more preferably in the range of 10,000 to 100,000. The solution polymer porogens typically have a particle size up to about 1,000 nm, such as in the range of 0.5 to 1000 nm. It is preferred that the particle size is in the range of about 0.5 to about 200 nm, more preferably from about 0.5 about 50 nm, and most preferably from about 1 nm to about 20 nm. The polydispersity of these solution polymers is in the range 1 to 20 and more preferably in the range of 1.001 to 15 and most preferably in the range of 1.001 to 10.

The emulsion polymers useful in the present invention are generally prepared the methods described in U.S. patent application Ser. No. 09/460,326, described above.

It is preferred that the polymers of the present invention are prepared using anionic polymerization or free radical polymerization techniques. It is also preferred that the polymers useful in the present invention are not prepared by step-growth polymerization processes.

The polymer particle porogens of the present invention preferably include cross-linked polymer chains. Any amount of cross-linker is suitable for use in the present invention. Typically, the porogens of the present invention contain at least 1% by weight, based on the weight of the porogen, of cross-linker. Up to and including 100% cross-linking agent, based on the weight of the porogen, may be effectively used in the particles of the present invention. It is preferred that the amount of cross-linker is from about 1% to about 80%, and more preferably from about 1% to about 60%. It will be appreciated by those skilled in the art that as the amount of cross-linker in the porogen increases, the conditions for removal of the porogen from the dielectric matrix may change.

Suitable cross-linkers useful in the present invention include di-, tri-, tetra-, or higher multi-functional ethylenically unsaturated monomers. Examples of cross-linkers useful in the present invention include, but are not limited to:

trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3-diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof. Silyl containing monomers that are capable of undergoing cross-linking may also be used as cross-linkers, such as, but not limited to, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly (vinylhydrosiloxane), poly(phenylvinylsiloxane), tetraallylsilane, 1,3-dimethyl tetravinyldisiloxane, 1,3-divinyl tetramethyldisiloxane and mixtures thereof.

Particularly suitable porogens include those having as polymerized units one or more polymers selected from STY/ALMA, EHA/STY/ALMA, BzA/DVB, BzA/TMPTMA, MMA/ALMA, EHA/TMPTMA, EHMA/TMPTMA, HEMA/STY/ALMA, HEMA/STY/TMPTMA, HEMA/ALMA, MMA/HEMA/ALMA, PPGMEA260/HEMA/TMPTA, or PPGMEA260/DMAEMA/TMPTA.

The porogen particles of the present invention may be directly added to the B-staged polyimide dielectric material as is or may be first purified to remove impurities that might effect the electrical or physical properties of electronic devices. Purification of the porogen particles may be accomplished either by precipitation of the porogen particles or adsorption of the impurities.

In general, the particles of the present invention useful as porogens must be dispersible, miscible or otherwise substantially compatible with the host B-staged dielectric matrix material in solution and in the thin film. Thus, the porogen must be soluble in the same solvent or mixed solvent system as the host B-staged polyimide dielectric matrix material. Also, the porogen must be present within this solution as substantially discrete, substantially non-aggregated or substantially non-agglomerated particles in order to achieve the desired benefit of this invention, namely substantially uniformly dispersed pores with a size comparable to that of the porogen's size. This is accomplished by modifying the porogen composition such that it is "compatible" with the host B-staged polyimide dielectric matrix material. Thus, the use of the appropriate substituted or functional monomers at an appropriate concentration in the preparation of the porogen allows for complete dispersion, or preferably dissolution, of the porogen polymers of the present invention into the host polyimide dielectric matrix material.

An advantage of the present invention is that the porogens are selected so as to be substantially compatible, and preferably fully compatible, with the dielectric material used. By "compatible" is meant that a composition of B-staged polyimide dielectric matrix material and porogen are optically transparent to visible light. It is preferred that a solution of B-staged polyimide dielectric matrix material and porogen, a film or layer including a composition of B-staged polyimide dielectric material and porogen, a composition including B-staged polyimide dielectric matrix material having porogen dispersed therein, and the resulting porous dielectric material after removal of the porogen are all optically transparent to visible light. By "substantially compatible" is meant that a composition of B-staged polyimide dielectric matrix material and porogen is slightly cloudy or slightly opaque. Preferably, "substantially compatible" means at least one of a solution of B-staged polyimide dielectric matrix material and porogen, a film or layer including a composition of B-staged polyimide dielectric matrix material and porogen, a composition including B-staged polyimide dielectric matrix material having porogen dispersed therein, and the resulting porous polyimide dielectric material after removal of the porogen is slightly cloudy or slightly opaque.

To be compatible, the porogen must be soluble or miscible in the B-staged polyimide dielectric matrix material, in the solvent used to dissolve the B-staged polyimide dielectric matrix material or both. When a film or layer of a composition including the B-staged polyimide dielectric material, porogen and solvent is cast, such as by spin casting, much of the solvent evaporates. After such film casting, the porogen must be soluble in the B-staged polyimide dielectric matrix material so that it remains substantially uniformly dispersed. If the porogen is not compatible, phase separation of the porogen from the B-staged polyimide dielectric matrix material occurs and large domains or aggregates form, resulting in an increase in the size and non-uniformity of pores. Such compatible porogens provide cured dielectric materials having substantially uniformly dispersed pores having substantially the same sizes as the porogen particles.

The compatibility of the porogens and B-staged polyimide dielectric matrix material is typically determined by a matching of their solubility parameters, such as the Van Krevelen parameters of delta h and delta v. See, for example, Van Krevelen et al., *Properties of Polymers. Their Estimation and Correlation with Chemical Structure,* Elsevier Scientific Publishing Co., 1976; Olabisi et al., *Polymer-Polymer Miscibility,* Academic Press, NY, 1979; Coleman et al., *Specific Interactions and the Miscibility of Polymer Blends,* Technomic, 1991; and A. F. M. Barton, *CRC Handbook of Solubility Parameters and Other Cohesion Parameters,* $2^{nd}$ Ed., CRC Press, 1991. Delta h is a hydrogen bonding parameter of the material and delta v is a measurement of both dispersive and polar interaction of the material. Such solubility parameters may either be calculated, such as by the group contribution method, or determined by measuring the cloud point of the material in a mixed solvent system consisting of a soluble solvent and an insoluble solvent. The solubility parameter at the cloud point is defined as the weighted percentage of the solvents. Typically, a number of cloud points are measured for the material and the central area defined by such cloud points is defined as the area of solubility parameters of the material.

When the solubility parameters of the porogen and B-staged polyimide dielectric matrix material are substantially similar, the porogen will be compatible with the dielectric matrix material and phase separation and/or aggregation of the porogen is less likely to occur. It is preferred that the solubility parameters, particularly delta h and delta v, of the porogen and B-staged polyimide dielectric matrix material are substantially matched. It will be appreciated by those skilled in the art that the properties of the porogen that affect the porogen's solubility also affect the compatibility of that porogen with the B-staged polyimide dielectric matrix material. It will be further appreciated by those skilled in the art that a porogen may be compatible with one polyimide dielectric matrix material, but not another. This is due to the difference in the solubility parameters of the different B-staged polyimide dielectric matrix materials.

To be useful as porogens in forming porous dielectric materials, the porogens of the present invention must be at least partially removable under conditions which do not adversely affect the dielectric matrix material, preferably substantially removable, and more preferably completely removable. By "removable" is meant that the polymer depolymerizes or otherwise breaks down into volatile components or fragments which are then removed from, or migrate out of, the dielectric material yielding pores or voids. Any procedures or conditions which at least partially remove the porogen without adversely affecting the dielectric matrix material may be used. It is preferred that the porogen is substantially removed. Typical methods of removal include, but are not limited to, exposure to heat or radiation, such as, but not limited to, UV, x-ray, gamma ray, alpha particles, neutron beam or electron beam. It is preferred that the matrix material is exposed to heat or UV light to remove the porogen.

The porogens of the present invention can be thermally removed under vacuum, nitrogen, argon, mixtures of nitrogen and hydrogen, such as forming gas, or other inert or reducing atmosphere. The porogens of the present invention may be removed at any temperature that is higher than the thermal curing temperature of the B-staged polyimide matrix material and lower than the thermal decomposition temperature of the polyimide dielectric material. Typically, the porogens of the present invention may be removed at temperatures in the range of 150° to 500° C. and preferably in the range of 250° to 450° C. Typically, the porogens of the present invention are removed upon heating for a period of time in the range of 1 to 120 minutes. An advantage of the porogens of the present invention is that 0 to 20% by weight of the porogen remains after removal from the polyimide dielectric material.

In one embodiment, when a porogen of the present invention is removed by exposure to radiation, the porogen polymer is typically exposed under an inert atmosphere, such as nitrogen, to a radiation source, such as, but not limited to, visible or ultraviolet light. The porogen fragments generated from such exposure are removed from the matrix material under a flow of inert gas. The energy flux of the radiation must be sufficiently high to generate a sufficient number of free radicals such that porogen particle is at least partially removed. It will be appreciated by those skilled in the art that a combination of heat and radiation may be used to remove the porogens of the present invention.

In preparing the dielectric matrix materials of the present invention, the porogens described above are first dispersed within, or dissolved in, a B-staged polyimide dielectric material. Any amount of porogen may be combined with the B-staged polyimide dielectric matrix materials according to the present invention. The amount of porogen used will depend on the particular porogen employed, the particular B-staged polyimide dielectric matrix material employed, and the extent of dielectric constant reduction desired in the resulting porous dielectric material. Typically, the amount of porogen used is in the range of from 1 to 90 wt %, based on the weight of the B-staged polyimide dielectric matrix material, preferably from 10 to 80 wt %, and more preferably from 15 to 60 wt %. A particularly useful amount of porogen is in the range of form about 1 to about 60 wt %.

The porogens of the present invention may be combined with the B-staged polyimide dielectric material by any methods known in the art. Typically, the B-staged polyimide matrix material is first dissolved in a suitable solvent, such as, but not limited to, methyl isobutyl ketone, diisobutyl ketone, 2-heptanone, γ-butyrolactone, ε-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes, or mixtures thereof, to form a solution. The porogen particles are then dispersed or dissolved within the solution. The resulting dispersion is then deposited on a substrate by methods known in the art, such as spin coating, spray coating or doctor blading, to form a film or layer.

After being deposited on a substrate, the B-staged polyimide dielectric matrix material is then substantially cured to form a film, layer or coating. The dielectric matrix material is typically cured by heating at a temperature below that required for removal of the porogen. Suitable cure temperatures for the B-staged polyimide dielectric matrix material vary across a wide range but are generally from about 150° to about 455° C., preferably from about 200° to about 400° C.

Once the B-staged polyimide dielectric matrix material is cured, the film is subjected to conditions which remove the porogen without substantially degrading the polyimide dielectric material, that is, less than 5% by weight of the dielectric material is lost. Typically, such conditions include exposing the film to heat and/or radiation. It is preferred that the material is exposed to heat or light to remove the porogen. To remove the porogen thermally, the dielectric material can be heated by oven heating or microwave heating. Under typical thermal removal conditions, the polymerized dielectric material is heated to about 300° to about 450° C. It will be recognized by those skilled in the art that the particular removal temperature of a thermally labile porogen will vary according to composition of the porogen. The choice of porogen will depend upon the thermal degradation temperature of the polyimide dielectric material. Upon removal, the porogen polymer depolymerizes or otherwise breaks down into volatile components or fragments which are then removed from, or migrate out of, the dielectric matrix material yielding pores or voids, which fill up with the carrier gas used in the process. Thus, a porous polyimide dielectric material having voids is obtained, where the size of the voids is substantially the same as the particle size of the porogen. The resulting dielectric material having voids thus has a lower dielectric constant than such material without such voids.

The compatible, i.e., optically transparent, compositions of the present invention do not suffer from agglomeration or long range ordering of porogen materials, i.e. the porogen is substantially uniformly dispersed throughout the B-staged polyimide dielectric matrix material. Thus, the porous polyimide dielectric materials resulting from removal of the porogen have substantially uniformly dispersed pores. Such substantially uniformly dispersed, very small pores are very effective in reducing the dielectric constant of the dielectric materials.

A further advantage of the present invention is that low dielectric constant materials are obtained having uniformly dispersed voids, a higher volume of voids than known dielectric materials and/or smaller void sizes than known dielectric materials. These voids are on the order of 0.5 to 1000 nm, preferably 0.5 to 200 nm, more preferably 0.5 to 50 nm, and most preferably 1 to 20 nm. Further, the void size can be adjusted, from 1 to 1000 nm and above, by varying the size of the removable porogen particles. The resulting porous polyimide dielectric material has low stress, less brittleness, low dielectric constant, low refractive index, improved toughness and improved compliance during mechanical contacting to require less contact force during compression. The porogens of the present invention also act as impact modifiers for the polyimide materials and improve polyimide film formation as well as film properties.

The porogens of the present invention are compatible with B-staged polyimide material without the need for further functionalization of the porogen. It is preferred that the present porogens are not further functionalized, and particularly that they are not further surface functionalized. Also, the present porogens are not incorporated into the vitrifying polymer, i.e. the porogens are not copolymerized with the B-staged polyimide dielectric material. The present porogen particles are compatibilized with the B-staged polyimide matrix material by appropriate choice of monomer, crosslinking agent or both. The present porogens can be mixed or blended with the B-staged polyimide material without macroscopic phase separation. Phase separation typically results in a visually detectable second layer, i.e. the compositions are opaque. The compositions of the present invention containing porogen in a polyimide dielectric matrix material are substantially non-phase separated and preferably are not phase separated. Surprisingly, phase separation of the porogens is prevented according to the present invention by compatibilizing the porogens with the polyimide dielectric matrix material. Such compatibilization, which is based on solubility, is achieved by choice of monomers used to prepare the porogen, not by immobilizing the porogen in the matrix polymer.

The porous polyimide dielectric material made by the process of the present invention is suitable for use in any application where a low refractive index or low dielectric constant material may be used. When the porous dielectric material of the present invention is a thin film, it is useful as insulators, anti-reflective coatings, sound barriers, thermal breaks, insulation, optical coatings and the like. The porous polyimide dielectric materials of the present invention are preferably useful in electronic and optoelectronic devices including, but not limited to, the fabrication of multilevel integrated circuits, e.g. microprocessors, digital signal processors, memory chips and band pass filters, thereby increasing their performance and reducing their cost.

The porous polyimide dielectric materials of the present invention are particularly suitable for use in integrated circuits, optoelectronic devices and wireless devices such as mobile telephones. The present porous polyimides are suitable used on a variety of substrates, such as, but not limited to, gallium arsenide, silicon-germanium, silicon-on-insulator, silicon, alumina, aluminum-nitride, printed wiring boards, flexible circuits, multichip modules, flip chips, copper, copper alloys, aluminum, high dielectric materials, low dielectric materials, resistors, barrier layers such as titanium or tantalum nitride, etch stop or cap layers such as silicon nitride, silicon oxide or silicon oxycarbide, and the like. It will be appreciated that an overlayer may be applied to such porous polyimides in certain applications.

In one embodiment of integrated circuit manufacture, as a first step, a layer of a composition including B-staged polyimide dielectric matrix material having a polymeric porogen dispersed or dissolved therein and optionally a solvent is deposited on a substrate. Suitable deposition methods include spin casting, spray casting and doctor blading. Suitable optional solvents include, but are not limited to: methyl isobutyl ketone, diisobutyl ketone, 2-heptanone, γ-butyrolactone, ϵ-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes or mixtures thereof. Suitable substrates include, but are not limited to: silicon, silicon dioxide, silicon oxycarbide, silicon germanium, silicon-on-insulator, glass, silicon nitride, ceramics, aluminum, copper, gallium arsenide, plastics, such as polycarbonate, circuit boards, such as FR-4 and polyimide, and hybrid circuit substrates, such as aluminum nitride-alumina. Such substrates may further include thin films deposited thereon, such films including, but not limited to: metal nitrides, metal carbides, metal silicides, metal oxides, and mixtures thereof. In a multilayer integrated circuit device, an underlying layer of insulated, planarized circuit lines can also function as a substrate.

In a second step in the manufacture of integrated circuits, the B-staged polyimide matrix material is cured to form a polyimide dielectric matrix material. In a third step, the resulting cured polyimide dielectric matrix material is then subjected to conditions such that the porogen contained therein is substantially removed without adversely affecting the dielectric material to yield a porous polyimide dielectric material.

The porous polyimide dielectric material is then lithographically patterned to form vias and/or trenches in subsequent processing steps. The trenches generally extend to the substrate and connect to at least one metallic via. Typically, lithographic patterning involves (i) coating the dielectric material layer with a positive or negative photoresist, such as those marketed by Shipley Company (Marlborough, Mass.); (ii) imagewise exposing, through a mask, the photoresist to radiation, such as light of appropriate wavelength or e-beam; (iii) developing the image in the resist, e.g., with a suitable developer; and (iv) transferring the image through the dielectric layer to the substrate with a suitable transfer technique such as reactive ion beam etching. Optionally, an antireflective composition may be disposed on the dielectric material prior to the photoresist coating. Such lithographic patterning techniques are well known to those skilled in the art.

A metallic film is then deposited onto the patterned dielectric layer to fill the trenches. Preferred metallic materials include, but are not limited to: copper, tungsten, gold, silver, aluminum or alloys thereof. The metal is typically deposited onto the patterned dielectric layer by techniques well known to those skilled in the art. Such techniques include, but are not limited to: chemical vapor deposition ("CVD"), plasma-enhanced CVD, combustion CVD ("CCVD"), electro and electroless deposition, sputtering, or the like. Optionally, a metallic liner, such as a layer of nickel, tantalum, titanium, tungsten, or chromium, including nitrides or silicides thereof, or other layers such as barrier or adhesion layers, e.g. silicon nitride or titanium nitride, is deposited on the patterned and etched dielectric material.

In a fifth step of the process for integrated circuit manufacture, excess metallic material is removed, e.g. by planarizing the metallic film, so that the resulting metallic material is generally level with the patterned dielectric layer. Planarization is typically accomplished with chemical/ mechanical polishing or selective wet or dry etching. Such planarization methods are well known to those skilled in the art.

It will be appreciated by those skilled in the art that multiple layers of dielectric material, including multiple layers of polyimide dielectric material, and metal layers may subsequently be applied by repeating the above steps. The above steps in the manufacture on an electronic device may further include one or more other steps, such as, but not limited to, the application of etch stops, cap layers, barrier layers, seed layers and the like. It will be further appreciated by those skilled in the art the the compositions of the present invention are useful in any and all methods of integrated circuit manufacture.

The following examples are presented to illustrate further various aspects of the present invention, but are not intended to limit the scope of the invention in any aspect.

EXAMPLE 1

Porogens compatible with polyimide dielectric matrix materials were prepared. The compositions of these porogens are reported in Table 1.

TABLE 1

| Sample | Monomer Composition | Monomer Ratio |
|---|---|---|
| 1 | STY/ALMA | 90/10 |
| 2 | EHA/STY/ALMA | 20/70/10 |
| 3 | EHA/STY/ALMA | 45/45/10 |
| 4 | BzA/DVB | 90/10 |
| 5 | BzA/TMPTMA | 90/10 |
| 6 | MMA/ALMA | 90/10 |
| 7 | EHA/TMPTMA | |
| 8 | EHMA/TMPTMA | 90/10 |
| 9 | HEMA/STY/ALMA | 45/45/10 |
| 10 | HEMA/STY/TMPTMA | 45/45/10 |
| 11 | HEMA/ALMA | 90/10 |
| 12 | MMA/HEMA/ALMA | 45/45/10 |
| 13 | MMA/HEMA/ALMA | 60/30/10 |
| 14 | MMA/HEMA/ALMA | 75/15/10 |
| 15 | PPGMEA260/HEMA/TMPTA | 10/80/10 |
| 16 | PPGMEA260/HEMA/TMPTA | 80/10/10 |
| 17 | PPGMEA260/DMAEMA/TMPTA | 80/10/10 |

EXAMPLE 2

The compatibility of a number of porogen samples from Example 1 in a B-staged aromatic polyimide dielectric matrix material in N-methyl pyrrolidinone was determined. The B-staged polymide material was Pyralin PI-2808 polyimide, available from HD Microsystems. Compatibility determinations were performed by visually inspecting a film of the B-staged polyimide dielectric matrix material and porogen that was spun cast on a silicon wafer. The porogen was loaded into the B-staged polyimide dielectric matrix material at 30 to 50% by weight. All visual inspections were by naked-eye under daylight. All samples were clear unless otherwise noted. The porogen samples are reported as the monomers used to prepare the porogen sample along with the ratio. Film compatibility of the porogen in the polyimide dielectric material was determined after removal of the solvent, but before removal of the porogen. The compatibility results are reported in Table 2.

TABLE 2

| Sample | Solution Compatibility | Film Compatibility |
|---|---|---|
| 1 | clear | |
| 2 | translucent | |
| 3 | cloudy | |
| 4 | clear | |
| 9 | clear | |
| 10 | cloudy | |
| 12 | clear/translucent | clear |
| 13 | cloudy | |
| 14 | cloudy | |
| 15 | clear | clear |
| 17 | clear | clear |

Translucent refers to compositions that are very slightly cloudy. Cloudy samples result when the porogen and the polyimide matrix material are substantially compatible. Clear samples result when the porogen and the polyimide matrix material are compatible. Thus, the above data clearly show that the porogens of the present invention are substantially compatible with polyimide dielectric matrix material.

What is claimed is:

1. A method of preparing porous polyimide dielectric materials comprising the steps of: a) dispersing removable cross-linked polymeric porogen particles in B-staged polyimide dielectic material to form B-staged polyimide dielectric matrix material; b) forming a film of the B-staged polyimide dielectric matrix material; c) curing the B-staged polyimide dielectric matrix material to form a polyimide dielectric matrix material; and d) subjecting the polyimide dielectric matrix material to conditions which at least partially remove the porogen particles to form a porous polyimide dielectric material without substantially degrading the polyimide dielectric material; wherein the porogen particles are soluble in the B-staged polyimide dielectric matrix material and wherein the porogen particles comprise as polymerized units at least one monomer capable of hydrogen-bonding with the B-staged polyimide dielectric matrix material.

2. The method of claim 1 wherein the monomer capable of hydrogen-bonding with the B-staged polyimide dielectric matrix material is selected from hydroxyalkyl (meth) acrylates, hydroxystyrenes, primary-, secondary- or tertiary-aminoalkyl (meth)acrylates, (meth)acrylic acid and mixtures thereof.

3. The method of claim 1 wherein the polyimide dielectric material comprises one or more aromatic tetracarboxylic acid dianhydrides and one or more aromatic diamines.

4. The method of claim 3 wherein the one or more aromatic tetracarboxylic acid dianhydrides have the Formula I:

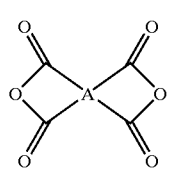

(I)

wherein A is a tetrasubstituted $(C_6-C_{20})$aromatic group.

5. The method of claim 4 wherein A is selected from (1) a pyromellitic group, (2) a polycyclic aromatic group such as naphthylene, fluorenylene, benzofluorenylene, anthracenylene, and halo, $(C_1-C_{10})$alkyl- or $(C_1-C_{10})$ haloalkyl-substituted derivatives thereof, and (3) moieties of Formula II

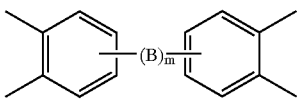

(II)

wherein B is a covalent bond, a C(R)₂, CO, O, S, SO₂, Si(C₂H₅)₂, N(R¹)₂, or combinations thereof; m is an integer of 1 to 10; each R is independently selected from H or C(R²)₃; each R¹ is independently selected from H, (C₁–C₂₀) alkyl, (C₁–C₂₀)haloalkyl, (C₆–C₂₀)aryl or (C₆–C₂₀)haloaryl; and each R² is independently selected from H, fluorine, or chlorine.

6. The method of claim 4 wherein the dianhydride is selected from pyromellitic dianhydride, 3,6-diphenylpyromellitic dianhydride, 3,6-bis(trifluoromethyl) pyromellitic dianhydride, 3,6-bis(methyl)pyromellitic dianhydride, 3,6-diiodopyromellitic dianhydride, 3,6-dibromopyromellitic dianhydride, 3,6-dichloropyromellitic dianhydride, 3,3',4,4'-benzophenonetetracarboxylic acid dianhydride, 2,3,3',4'-benzophenonetetracarboxylic acid dianhydride, 2,2'3,3'-benzophenonetetracarboxylic acid dianhydride, 3,3',4,4'-biphenyltetracarboxylic acid dianhydride, bis(2,3-dicarboxyphenyl)methane dianhydride, bis(2,5,6-trifluoro-3,4-dicarboxyphenyl)methane dianhydride, 2,2-bis(3,4-dicarboxyphenyl)propane dianhydride, 2,2'-bis(3,4-dicarboxyphenyl) hexafluoropropane dianhydride (6FDA), bis(3,4-dicarboxyphenyl)ether dianhydride, 4,4'-oxydi(phthalic anhydride), 3,3',4,4'-diphenylsulfonetetracarboxylic acid dianhydride, 4,4'-[4,4'-isopropylidene-di(p-phenyleneoxy)]-bis(phthalic anhydride), N,N-(3,4-dicarboxyphenyl)-N-methylamine dianhydride, bis(3,4-dicarboxyphenyl) diethylsilane dianhydride, naphthalene tetracarboxylic acid dianhydrides such as 2,3,6,7- and 1,2,5,6-naphthalenetetracarboxylic acid dianhydrides, 2,6-dichloronaphthalene-1,4,5,8-tetracarboxylic acid dianhydride, and heterocyclic aromatic tetracarboxylic acid dianhydrides such as thiophene-2,3,4,5-tetracarboxylic acid dianhydride, pyrazine-2,3,5,6-tetracarboxylic acid dianhydride, and pyridine-2,3,5,6-tetracarboxylic acid dianhydride.

7. The method of claim 3 wherein the one or more aromatic diamines have the structure of Formulae III or IV:

H₂N—Ar—NH₂ (III)

H₂N—Ar—L—Ar—NH₂ (IV)

wherein Ar is an aryl group selected from phenylene, naphthylene, anthrylene, phenanthrylene, heterocyclic groups having at least one of sulfur, nitrogen, or oxygen in the heterocyclic ring, and the like; and L is a linking group selected from a covalent bond, SO₂, (CR³R⁴)ₙ, aryl, O, and S; R³ and R⁴ are independently selected from hydrogen, (C₁–C₆)alkyl, halo(C₁–C₆)alkyl, and aryl; and n=1–10.

8. The method of claim 7 wherein the one or more aromatic diamines are selected from o-, m- and p-phenylenediamine, 2-methyl(p-phenylenediamine), 2,5-dimethyl(p-phenylenediamine), 2-ethyl(p-phenylenediamine), 2,5-diethyl(p-phenylenediamine), naphthylenediamine, anthrylenediamine, phenanthrylenediamine, 1,1-bis(4-aminophenyl)-1-phenyl-2,2,2-trifluoroethane, 9,9-bis(aminoaryl)fluorenes such as 9,9-bis(aminophenyl)fluorene, 9,9-bis(3-methyl-4-aminophenyl)fluorene, 9,9-bis(3,5-dimethyl-4-aminophenyl)fluorene, 9,9-bis(3,5-diethyl-4-aminophenyl) fluorene, and 9,9-bis(3-ethyl-5-methyl-4-aminophenyl) fluorene, N,N'-bis(4-aminophenyl)-2,5-(diisopropoxycarbony)benzene-1,4-dicarbox-amide, 2,4-diaminotoluene, 1,4-diamino-2-methoxybenzene, 1,4-diamino-2-phenylbenzene, 1,3-diamino-4-chlorobenzene, 4,4'-diaminobiphenyl, 4,4'-diaminodiphenylmethane, 2,2-bis(4-aminophenyl)propane, 2,2-bis(4-aminophenyl)-1,1,1,3,3,3-hexafluoropropane, 4,4'-diaminodiphenyl ether, 3,4-diaminodiphenyl ether, 1,3-bis(3-aminophenoxy)benzene, 1,3-bis(4-aminophenoxy)benzene, 1,4-bis(4-aminophenoxy)benzene, 4,4'-bis(4-aminophenoxy) biphenyl, 4,4'-bis(3-aminophenoxy)biphenyl, 2,2-bis{4-(4-aminophenoxy)phenyl}propane, 2,2-bis{4-(4-aminophenoxy)phenyl}propane, 2,2-bis{4-(4-aminophenoxy)phenyl}-1,1,1,3,3,3-hexafluoropropane, 4,4'-diaminodiphenyl thioether, 4,4'-diaminodiphenyl sulfone, 2,2'-diaminobenzophenone, 3,3'-diaminobenzophenone; 1,8-diaminonaphthalene, 1,5-diaminonaphthalene, 2,6-diaminopyridine, 2,4-diaminopyrimidine, 2,4-diamino-s-triazine, and combinations thereof.

9. The method of claim 1 wherein the porogen comprises as polymerized units one or more polymers selected from STY/ALMA, EHA/STY/ALMA, BzA/DVB, BzA/TMPTMA, MMA/ALMA, EHA/TMPTMA, EHMA/TMPTMA, HEMA/STY/ALMA, HEMA/STY/TMPTMA, HEMA/ALMA, MMA/HEMA/ALMA, PPGMEA260/HEMA/TMPTA, or PPGMEA260/DMAEMA/TMPTA.

10. A porous polyimide dielectric material prepared by the method of claim 1.

11. A method of preparing an integrated circuit comprising the steps of: a) depositing on a substrate a layer of a composition including B-staged polyimide dielectric matrix material having cross-linked polymeric porogen particles dispersed therein; b) curing the B-staged polyimide dielectric matrix material to form a polyimide dielectric matrix material; c) subjecting the polyimide dielectric matrix material to conditions which at least partially remove the porogen particles to form a porous polyimide dielectric material layer without substantially degrading the polyimide dielectric material; d) patterning the polyimide dielectric layer; e) depositing a metallic film onto the patterned polyimide dielectric layer; and f) planarizing the film to form an integrated circuit; wherein the porogen particles are soluble in the B-staged polyimide dielectric matrix material and wherein the porogen particles include as polymerized units at least one monomer capable of hydrogen-bonding with the B-staged polyimide dielectric matrix material.

12. The method of claim 11 wherein the monomer capable of hydrogen-bonding with the B-staged polyimide dielectric matrix material is selected from hydroxyalkyl (meth) acrylates, hydroxystyrenes, primary-, secondary- or tertiary-aminoalkyl (meth)acrylates, (meth)acrylic acid and mixtures thereof.

13. The method of claim 11 wherein the polyimide dielectric material comprises one or more aromatic tetracarboxylic acid dianhydrides and one or more aromatic diamines.

14. The method of claim 11 wherein the porogen comprises as polymerized units one or more polymers selected from STY/ALMA, EHA/STY/ALMA, BzA/DVB, BzA/TMPTMA, MMA/ALMA, EHA/TMPTMA, EHMA/TMPTMA, HEMA/STY/ALMA, HEMA/STY/TMPTMA, HEMA/ALMA, MMA/HEMA/ALMA, PPGMEA260/HEMA/TMPTA, or PPGMEA260/DMAEMA/TMPTA.

15. A composition comprising a B-staged polyimide dielectric matrix material and cross-linked polymeric porogen particles, wherein the porogen particles are soluble in the B-staged polyimide dielectric matrix material and wherein the porogen particles comprise as polymerized units at least one monomer capable of hydrogen-bonding with the B-staged polyimide dielectric matrix material.

16. The composition of claim 15 wherein the monomer capable of hydrogen-bonding with the B-staged polyimide dielectric matrix material is selected from hydroxyalkyl (meth)acrylates, hydroxystyrenes, primary-, secondary- or tertiary-aminoalkyl (meth)acrylates, (meth)acrylic acid and mixtures thereof.

17. The composition of claim 15 wherein the porogen comprises as polymerized units one or more polymers selected from STY/ALMA, EHA/STY/ALMA, BzA/DVB, BzA/TMPTMA, MMA/ALMA, EHA/TMPTMA, EHMA/TMPTMA, HEMA/STY/ALMA, HEMA/STY/TMPTMA, HEMA/ALMA, MMA/HEMA/ALMA, PPGMEA260/HEMA/TMPTA, or PPGMEA260/DMAEMA/TMPTA.

18. The method of claim 1 wherein the porogen particles are not copolymerized with the B-staged polyimide dielectric material.

19. The method of claim 11 wherein the porogen particles are not copolymerized with the B-staged polyimide dielectic material.

* * * * *